United States Patent
Park et al.

(10) Patent No.: US 10,482,971 B2
(45) Date of Patent: Nov. 19, 2019

(54) SEMICONDUCTOR MEMORY APPARATUS AND OPERATING METHOD OF THE SEMICONDUCTOR MEMORY APPARATUS

(71) Applicant: SK hynix Inc., Icheon-si, Gyeonggi-do (KR)

(72) Inventors: Jin Su Park, Icheon-si (KR); Taek Seung Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/014,306

(22) Filed: Jun. 21, 2018

(65) Prior Publication Data

US 2019/0115079 A1 Apr. 18, 2019

(30) Foreign Application Priority Data

Oct. 17, 2017 (KR) .......................... 10-2017-0134521

(51) Int. Cl.
*G11C 11/00* (2006.01)
*G11C 16/10* (2006.01)
*G11C 13/00* (2006.01)
*G11C 7/06* (2006.01)
*G11C 7/10* (2006.01)

(52) U.S. Cl.
CPC ............... *G11C 16/10* (2013.01); *G11C 7/06* (2013.01); *G11C 13/0004* (2013.01); *G11C 13/0038* (2013.01); *G11C 13/0069* (2013.01); *G11C 7/1069* (2013.01); *G11C 2013/0078* (2013.01); *G11C 2207/005* (2013.01)

(58) Field of Classification Search
CPC ............ G11C 13/0069; G11C 13/0004; G11C 13/0007; G11C 2213/79; G11C 2213/72
USPC .................................................... 365/148, 163
See application file for complete search history.

(56) References Cited

U.S. PATENT DOCUMENTS

| 9,384,831 B2 | 7/2016 | Taub et al. | |
| 2010/0124104 A1* | 5/2010 | Sato | G11C 7/1078 365/163 |
| 2013/0058154 A1* | 3/2013 | Katagiri | G11C 8/10 365/148 |

FOREIGN PATENT DOCUMENTS

KR 101559445 B1 10/2015
KR 1020180063956 A 6/2018

* cited by examiner

*Primary Examiner* — Son T Dinh
(74) *Attorney, Agent, or Firm* — William Park & Associates Ltd.

(57) ABSTRACT

A semiconductor memory apparatus includes a memory cell. The semiconductor apparatus includes a current supply circuit configured to change a resistance state of the memory cell, by changing an amount of current flowing through the memory cell, with or without limiting a voltage level across the memory cell to a level of a clamping voltage based on a state of the memory cell.

27 Claims, 7 Drawing Sheets

SEMICONDUCTOR MEMORY APPARATUS AND OPERATING METHOD OF THE SEMICONDUCTOR MEMORY APPARATUS

CROSS-REFERENCES TO RELATED APPLICATION

The present application claims priority under 35 U.S.C. § 119(a) to Korean application number 10-2017-0134521, filed on Oct. 17, 2017, in the Korean Intellectual Property Office, which is incorporated herein by reference in its entirety.

BACKGROUND

1. Technical Field

Various embodiments generally relate to a semiconductor technology, and, more particularly, to a semiconductor memory apparatus and an operating method of the semiconductor memory apparatus.

2. Related Art

Electronic apparatuses may consist of a large number of electronic components. Among the electronic apparatuses, a computer system may consist of many electronic components which are constructed by semiconductors. The computer system may include a memory device. A DRAM is being widely used as a general memory device because it has advantages in that it is able to input/output data at a high speed and is capable of a random access. However, because the DRAM includes memory cells each constructed by a capacitor, the DRAM has a volatile characteristic in that it loses stored data when power supply is cut off. In order to overcome such a disadvantage of the DRAM, a flash memory device has been developed. Because the flash memory device includes memory cells each constructed by a floating gate, the flash memory device may have a nonvolatile characteristic in that it is able to retain stored data even though power supply is cut off. However, the flash memory device has disadvantages in that it performs a data input/output operation at a speed markedly slower than the DRAM and is difficult to perform a random access.

Recently, next-generation memory devices, such as a phase change RAM, a magnetic RAM, a resistive RAM and a ferroelectric RAM, which have a high operation speed and a nonvolatile characteristic, are being developed. The next-generation memory devices have advantages in that they have a nonvolatile characteristic and are able to operate at a high speed. In particular, the PRAM includes memory cells each of which is configured by a chalcogenide compound, and may store data by changing a resistance value of each memory cell.

SUMMARY

In an embodiment, a semiconductor memory apparatus may include a memory cell. The semiconductor memory apparatus may include a current supply circuit configured to perform a write operation by changing an amount of current flowing through the memory cell, perform a reset write operation without limiting a voltage level across the memory cell in a reset write operation, and limit the voltage level across the memory cell to a level of a clamping voltage in a set write operation.

In an embodiment, a semiconductor memory apparatus may include a memory cell. The semiconductor memory apparatus may include a current supply circuit configured to perform a write operation by changing an amount of current flowing through the memory cell, and limit a voltage level across the memory cell to a level of a clamping voltage based on whether the write operation is a set write operation or a reset write operation.

In an embodiment, a method for operating a semiconductor memory apparatus may include determining a resistance state of a memory cell by performing a pre-read operation. The method may include selectively limiting a voltage across a memory cell to a level of a clamping voltage based on whether it is a set write operation or a reset write operation.

In an embodiment, a semiconductor memory apparatus may include a memory cell. The semiconductor memory apparatus may include a current supply circuit configured to change a resistance state of the memory cell, by changing an amount of current flowing through the memory cell, with or without limiting a voltage level across the memory cell to a level of a clamping voltage based on a state of the memory cell prior to changing the resistance state of the memory cell.

DETAILED DESCRIPTION

Hereinafter, a semiconductor memory apparatus and an operating method thereof will be described below with reference to the accompanying drawings through various examples of embodiments.

Various embodiments may be directed to a semiconductor memory apparatus capable of performing a fast and stable write operation by selectively clamping a bit line during a write operation, and an operating method thereof.

Figure 1:
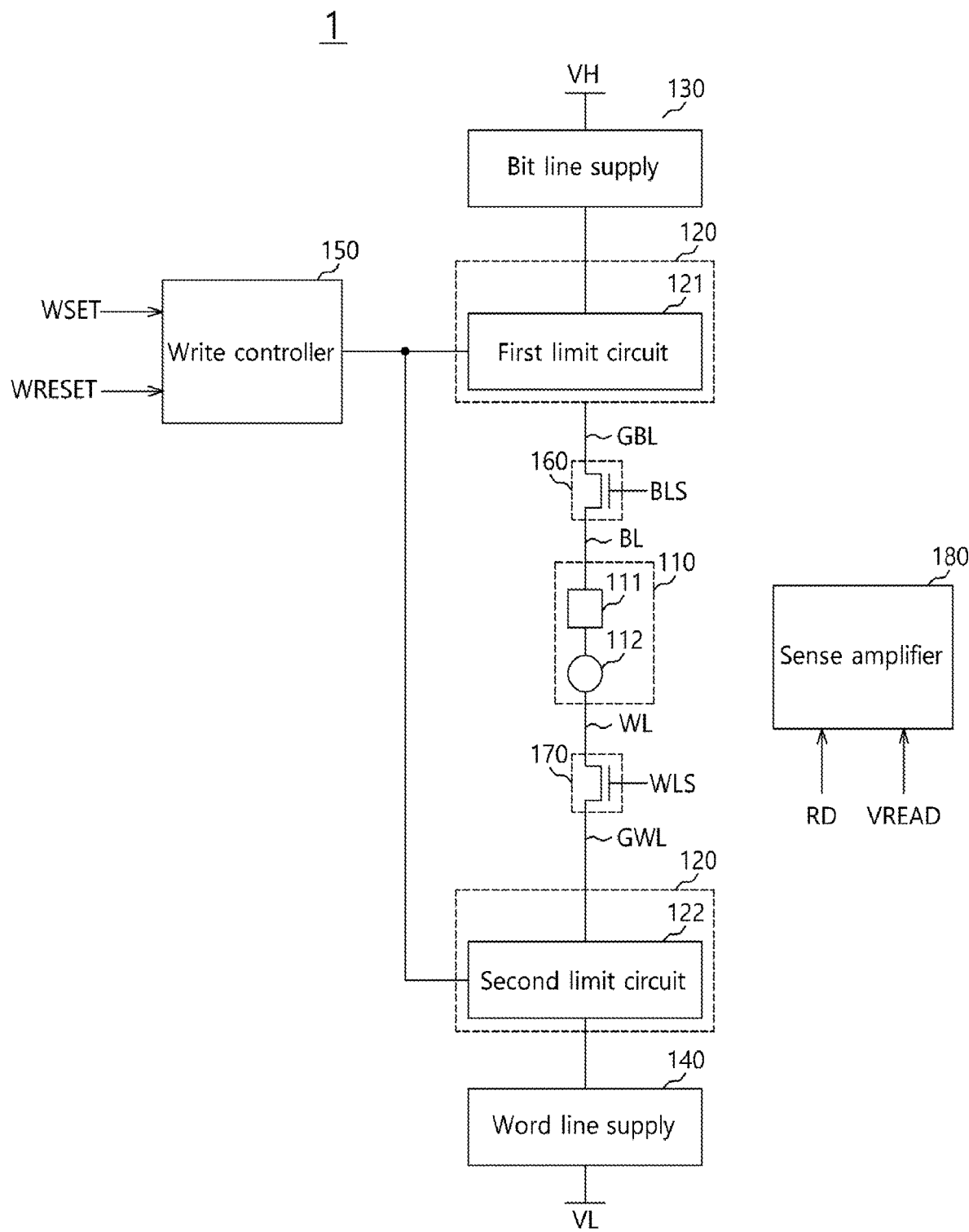
FIG. 1 is a diagram illustrating a representation of an example of the configuration of a semiconductor memory apparatus in accordance with an embodiment.

FIG. 1 is a diagram illustrating a representation of an example of the configuration of a semiconductor memory apparatus 1 in accordance with an embodiment. In FIG. 1, the semiconductor memory apparatus 1 may include a memory cell 110. The memory cell 110 may include a resistive element 111 and a switching element 112. The resistive element 111 of the memory cell 110 may have different resistance states depending on a current and/or a voltage applied during a write operation. For example, the memory cell 110 may have a high resistance state and/or a reset state and may have a low resistance state and/or a set state. The memory cell 110 may store different data depending on a resistance state. In an embodiment, the memory cell 110 may be changed to, not two states, but a plurality of states, and may store data of two or more bits. The switching element 112 may be turned on when a current equal to or larger than a threshold value is applied to the memory cell 110 or the voltage across the memory cell 110 and/or the voltage difference of both ends of the memory cell 110 is applied to be equal to or higher than a threshold value. When turned on, the switching element 112 allows an unlimited amount of current to flow through the memory cell 110. The switching element 112 may be an Ovonic threshold switch (OTS).

The memory cell 110 may be coupled between a global bit line GBL and a global word line GWL. The memory cell 110 may have one end which is coupled with the global bit line GBL and the other end which is coupled with the global word line GWL. The semiconductor memory apparatus 1 may have a hierarchical bit line and word line structure. The one end of the memory cell 110 may be coupled with a bit line BL, and the bit line BL may be coupled with the global bit line GBL through a column switch 160. The column switch 160 may couple the bit line BL and the global bit line GBL based on a bit line select signal BLS. The other end of the memory cell 110 may be coupled with a word line WL, and the word line WL may be coupled with the global word line GWL through a row switch 170, The row switch 170 may couple the word line WL and the global word line GWL based on a word line select signal WLS.

Figure 2:
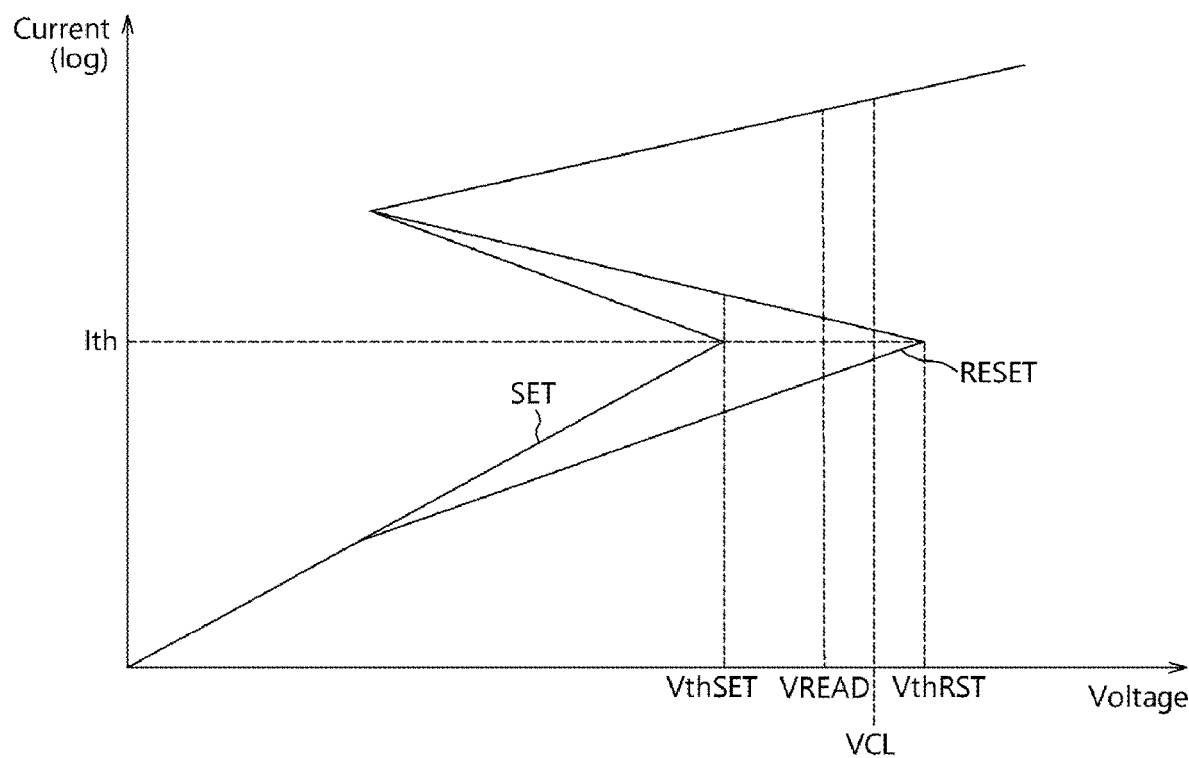
FIG. 2 is a representation of an example of a graph to assist in the explanation of the current and voltage characteristics of the switching element illustrated in FIG. 1.

FIG. 2 is a representation of an example of a graph to assist in the explanation of the current and voltage characteristics of the switching element 112 illustrated FIG. 1. In FIG. 2, the horizontal axis of the graph may be voltage, and the vertical axis of the graph may be current expressed in log scale. The switching element 112 may be turned off when a current equal to or smaller than a threshold current value Ith flows or the voltage across the memory cell 110, that is, the voltage difference of both ends of the memory cell 110, is equal to or lower than a set threshold voltage VthSET. When the switching element 112 is in a turned-off state, only a substantially small amount of current may flow through the memory cell 110. If the amount of current applied to the switching element 112 increases and becomes larger than the threshold current value Ith or the voltage difference of both ends of the memory cell 110 becomes higher than the set threshold voltage VthSET, the switching element 112 may be turned on. If the switching element 112 is turned on, an unlimited large amount of current may flow through the memory cell 110. A threshold voltage by which the switching element 112 may be turned on when the resistance state of the memory cell 110 is the set state may correspond to the set threshold voltage VthSET, and a threshold voltage by which the switching element 112 may be turned on when the resistance state of the memory cell 110 is the reset state may correspond to a reset threshold voltage VthRST. A read reference voltage VREAD which is used to read the data stored in the memory cell 110 may have a level between the set threshold voltage VthSET and the reset threshold voltage VthRST. FIG. 2 also illustrates the level of a clamp voltage VCL which may be greater than the read reference voltage VREAD and may be lower than the reset threshold voltage VthRST.

Referring again to FIG. 1, the semiconductor memory apparatus 1 may include a current supply circuit 120, a bit line supply 130 and a word line supply 140. The current supply circuit 120 may perform a write operation for the memory cell 110, and may change a current applied to the memory cell 110 or the voltage level across the memory cell 110 and/or the voltage level difference of both ends of the memory cell 110 to change the resistance state of the memory cell 110. The current supply circuit 120 may perform a set write operation and a reset write operation. The set write operation may be a program operation that changes the resistance state of the memory cell 110 to the set state, and the reset write operation may be a program operation that changes the resistance state of the memory cell 110 to the reset state. The current supply circuit 120 may apply a set pulse to the memory cell 110 during the set write operation, and may apply a reset pulse to the memory cell 110 during the reset write operation. In an embodiment, the set pulse may have a first amplitude and may have a first pulse width. The reset pulse may have a second amplitude that is larger than the first amplitude and may have a second pulse width that is shorter than the first pulse width.

The bit line supply 130 may provide a high voltage VH to the current supply circuit 120. The word line supply 140 may provide a low voltage VL to the current supply circuit 120. The high voltage VH may have a level higher than the low voltage VL. For example, the high voltage VH may have a voltage level corresponding to a pumping voltage or a program voltage, and the low voltage VL may have a voltage level corresponding to a ground voltage or a bulk bias voltage having a negative voltage level lower than the ground voltage. The current supply circuit 120 may be applied with the high voltage VH from the bit line supply 130, and may be applied with the low voltage VL from the word line supply 140.

The current supply circuit 120 may include a first limit circuit 121 and a second limit circuit 122. The first limit circuit 121 may be applied with the high voltage VH through the bit line supply 130, and may be coupled with the global bit line GBL. The second limit circuit 122 may be applied with the low voltage VL through the word line supply 140, and may be coupled with the global word line GWL. The first limit circuit 121 may change the amount of current applied to the memory cell 110 and/or the voltage level of the global bit line GBL during the write operation. The second limit circuit 122 may change the amount of current flowing through the memory cell 110 and/or the voltage level of the global word line GWL during the write operation. The first and second limit circuits 121 and 122 may change the voltage level across the memory cell 110, by changing the amount of current flowing through the memory cell 110 and/or the voltage levels of the global bit line GBL and the global word line GWL. The first and second limit circuits 121 and 122 may apply the set pulse and the reset pulse to the memory cell 110 by changing the amount of current flowing through the memory cell 110 and/or the voltage across the memory cell 110. In an embodiment, each of the first and second limit circuits 121 and 122 may be configured by a variable current source.

In FIG. 1, the semiconductor memory apparatus 1 may further include a write controller 150. The write controller 150 may control the operations of the first and second limit circuits 121 and 122 for the write operation for the memory cell 110. The write controller 150 may control the first and second limit circuits 121 and 122 based on a set write signal WSET and a reset write signal WRESET. The set write signal WSET may be enabled for the set write operation for the memory cell 110, and the reset write signal WRESET may be enabled for the reset write operation for the memory cell 110. The write controller 150 may control the first and second limit circuits 121 and 122 differently from each other, depending on whether the set write operation or the reset write operation is to be performed for the memory cell 110. In an embodiment, the write controller 150 may provide analog voltages and/or digital codes to the first and second limit circuits 121 and 122, and the first and second limit circuits 121 and 122 may adjust the amount of current flowing through the memory cell 110 based on the analog voltages and/or digital codes.

In FIG. 1, the semiconductor memory apparatus 1 may further include a sense amplifier 180. The sense amplifier 180 may perform a read operation for the memory cell 110, together with the current supply circuit 120. The sense amplifier 180 may determine the resistance state of the memory cell 110. The sense amplifier 180 may receive a read signal RD and the read reference voltage VREAD. The read signal RD may be enabled to perform the read operation for the memory cell 110. The sense amplifier 180 may be coupled to one of the global bit line GBL and the global word line GWL. During the read operation, the current supply circuit 120 may adjust the amount of current flowing through the memory cell 110, and the sense amplifier 180 may determine the resistance state of the memory cell 110 by comparing the levels of the voltage across the memory cell 110 and the read reference voltage VREAD. For example, when the voltage level across the memory cell 110 is lower than the level of the read reference voltage VREAD, it may be determined that the memory cell 110 is in the low resistance state and/or the set state. When the voltage level across the memory cell 110 is higher than the level of the read reference voltage VREAD, it may be determined that the memory cell 110 is in the high resistance state and/or the reset state.

Figure 3:
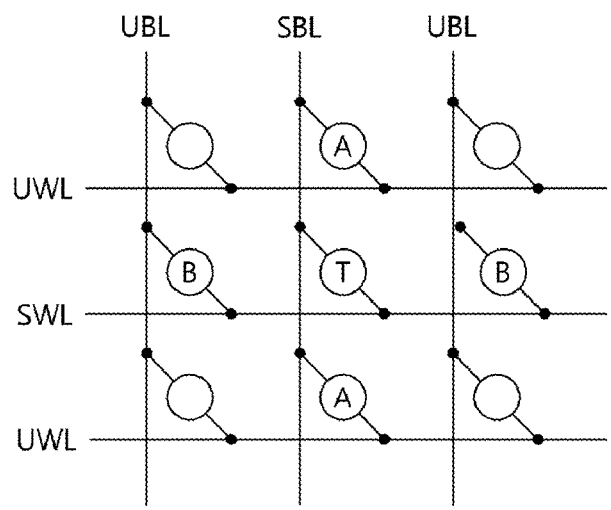
FIG. 3 is a diagram illustrating a representation of an example of the configuration of the memory cell array of the semiconductor memory apparatus in accordance with an embodiment.

FIG. 3 is a diagram illustrating a representation of an example of a memory cell array 300 of the semiconductor memory apparatus in accordance with an embodiment. The memory cell array 300 may be a cross point array. The memory cell array 300 may include a plurality of bit lines which are disposed to extend in a column direction and a plurality of word lines which are disposed to extend in a row direction. A plurality of memory cells may be coupled with the bit lines and the word lines at points where the plurality of bit lines and the plurality of word lines intersect with each other. In order to perform a write operation for a target memory cell T, a bit line SBL and a word line SWL which are coupled with the target memory cell T may be selected. Bit lines UBL and word lines UWL which are not coupled with the target memory cell T may be unselected. In order to write the target memory cell T to a set state or a reset state, the current supply circuit 120 shown in FIG. 1 may apply currents and/or voltages to the selected bit line SBL and the selected word line SWL through the global bit line GBL and the global word line GWL. The currents and/or the voltages applied from the current supply circuit 120 may be applied also to memory cells A which are coupled with the selected bit line SBL and memory cells B which are coupled with the selected word line SWL. In the case where the set threshold voltage and/or the reset threshold voltage of the target memory cell T is relatively higher than the memory cells A and B or the target memory cell T is a failed cell, the current and/or the voltage applied by the current supply circuit 120 to change the resistance state of the target memory cell T may increase, and a disturbance phenomenon may occur in which the adjacent memory cells A and B are turned on together before or when the target memory cell T is turned on. The disturbance phenomenon may change the resistance value of a memory cell and cause the data stored in the memory cell to be lost, and may deteriorate the reliability of the semiconductor memory apparatus 1.

Referring again to FIG. 1, the current supply circuit 120 may perform a clamping operation during the write operation to prevent the disturbance phenomenon. The current supply circuit 120 may limit the voltage level across the memory cell 110 not to be equal to or higher than the level of a clamping voltage, during the write operation. For example, the first limit circuit 121 may clamp the global bit line GBL to prevent the voltage level of the global bit line GBL from becoming equal to or higher than a predetermined level. In an embodiment, the second limit circuit 122 may clamp the global word line GWL to prevent the voltage level of the global word line GWL from becoming equal to or lower than a predetermined level. The level of the clamping voltage may be an optional voltage level which prevents the memory cells A and B coupled with the selected bit line SBL and the selected word line SWL to which the target memory cell T is coupled in FIG. 2, from being turned on by disturbance. The level of the clamping voltage may be an inhibit voltage level. The current supply circuit 120 may selectively clamp the voltage level across the memory cell 110, based on whether it is the set write operation or the reset write operation. For example, the current supply circuit 120 may limit the voltage level across the memory cell 110 not to be equal to or higher than the level of the clamping voltage, during the set write operation. The current supply circuit 120 might not clamp the voltage level across the memory cell 110 during the reset write operation. Therefore, a current sufficient to change the memory cell 110 to the reset state may be applied.

Figure 4A:
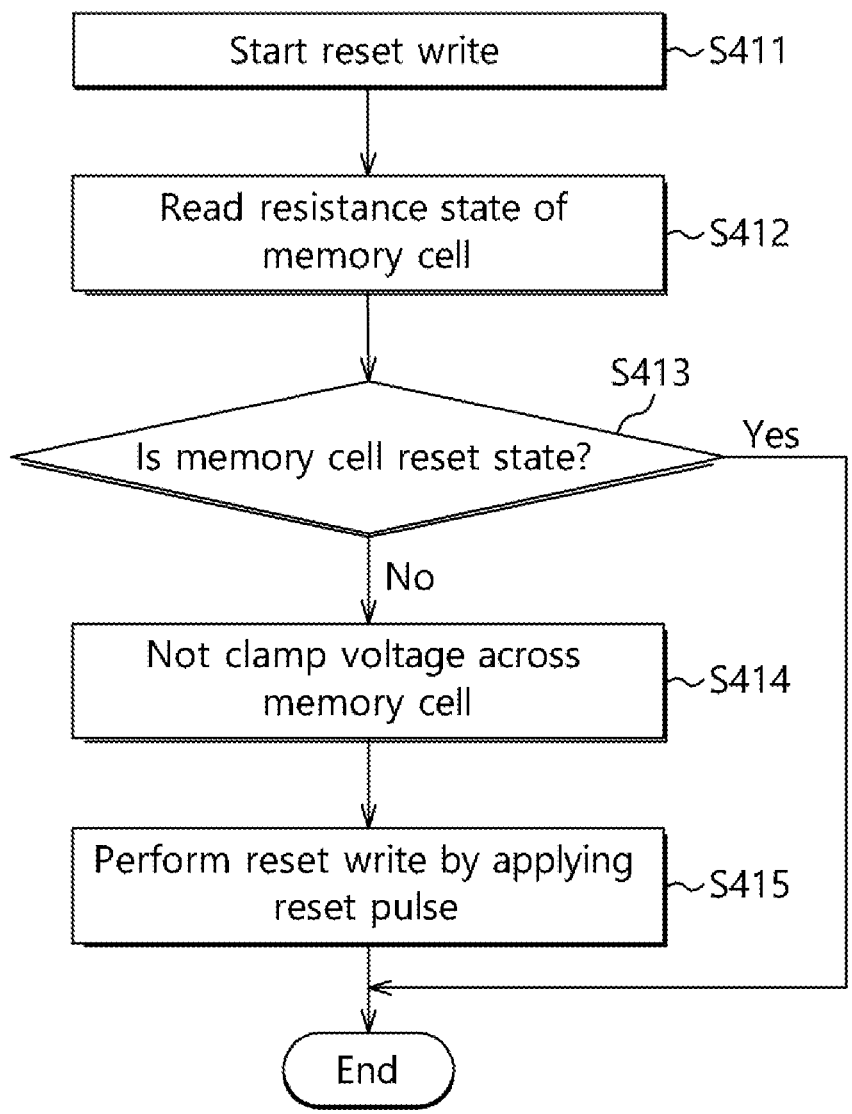
FIGS. 4A and 4B are representations of examples of flow charts to assist in the explanation of operations of the semiconductor memory apparatus in accordance with an embodiment.
Figure 4B:
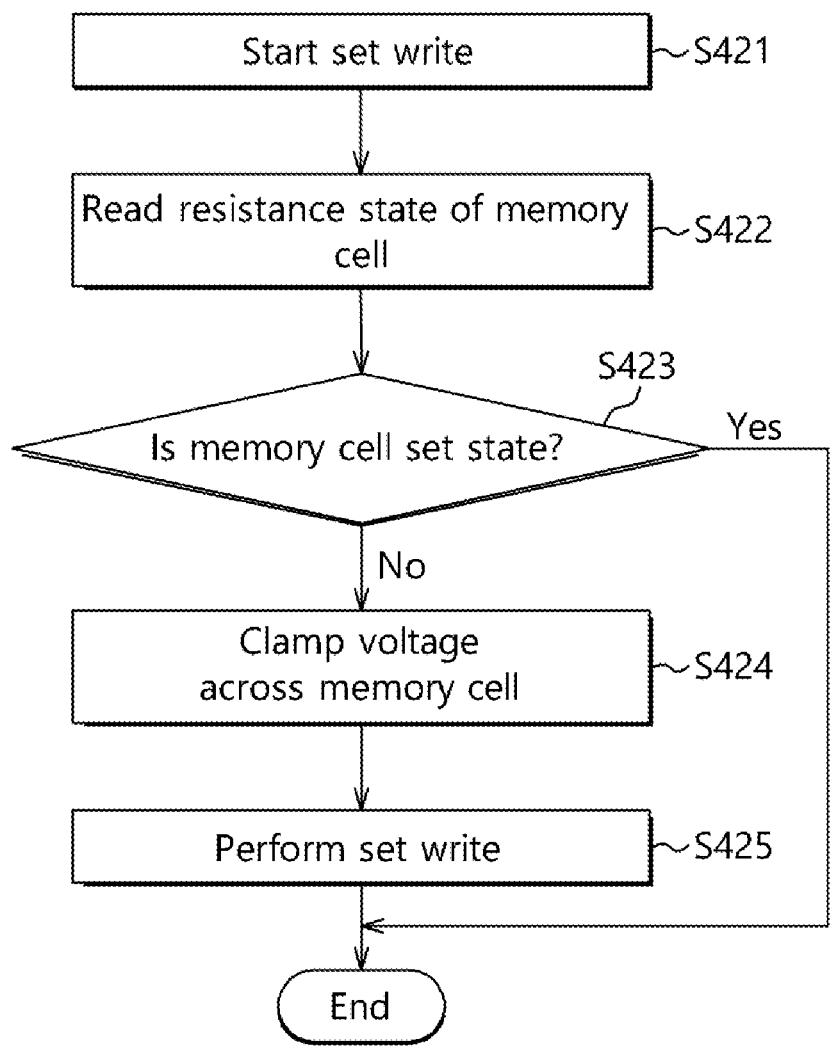

FIGS. 4A and 4B are representations of examples of flow charts to assist in the explanation of operations of the semiconductor memory apparatus 1 in accordance with an embodiment. The operating method of the semiconductor memory apparatus 1 in accordance with an embodiment will be described below with reference to FIGS. 1 to 4B. FIG. 4A is a representation of an example of a flow chart to assist in the explanation of the reset write operation of the semiconductor memory apparatus 1. As the reset write operation is started (S411), the semiconductor memory apparatus 1 may perform a read operation to determine the resistance state of the memory cell 110 (S412). The read operation may be a pre-read operation. The pre-read operation may be performed by the current supply circuit 120 and the sense amplifier 180. The sense amplifier 180 may determine whether the current resistance state of the memory cell 110 is the set state or the reset state (S413). When the resistance state of the memory cell 110 is the reset state, since it is not necessary for the reset write operation to be additionally performed, the reset write operation may be ended. When the resistance state of the memory cell 110 is the set state, the reset write operation may be performed to change the resistance state of the memory cell 110. The current supply circuit 120 might not clamp the voltage level across the memory cell 110 (S414). For example, the first limit circuit 121 might not limit or may forgo limiting the voltage level of the global bit line GBL. The current supply circuit 120 may perform the reset write operation through providing a reset pulse to the memory cell 110 by being controlled by the write controller 150 (S415). While not shown, after the reset pulse is applied, a verify read operation may be performed to determine whether the resistance state of the memory cell 110 is changed. When the resistance state of the memory cell 110 is changed to the reset state, the reset write operation may be ended.

FIG. 4B is a representation of an example of a flow chart to assist in the explanation of the set write operation of the semiconductor memory apparatus 1. As the set write operation is started (S421), the semiconductor memory apparatus 1 may perform a pre-read operation to determine the resistance state of the memory cell 110 (S422). The sense amplifier 180 may determine whether the current resistance state of the memory cell 110 is the set state or the reset state (S423). When the resistance state of the memory cell 110 is the set state, since it is not necessary for the set write operation to be additionally performed, the set write operation may be ended. When the resistance state of the memory cell 110 is the reset state, the set write operation may be performed to change the resistance state of the memory cell 110. The current supply circuit 120 may clamp the voltage across the memory cell 110 such that the voltage between both ends of the memory cell 110 does not become equal to or higher than the level of the clamping voltage (S424). For example, the first limit circuit 121 of the current supply circuit 120 may limit the voltage across the memory cell 110 to be lower than the level of the clamping voltage, by preventing the voltage level of the global bit line GBL from rising to be equal to or higher than the predetermined level. The current supply circuit 120 may perform the set write operation through providing a set pulse to the memory cell 110 by being controlled by the write controller 150 (S425). While not shown, after the set write is performed, a verify read operation may be performed to determine whether the resistance state of the memory cell 110 is changed. When the resistance state of the memory cell 110 is changed to the set state, the set write operation may be ended.

Figure 5A:
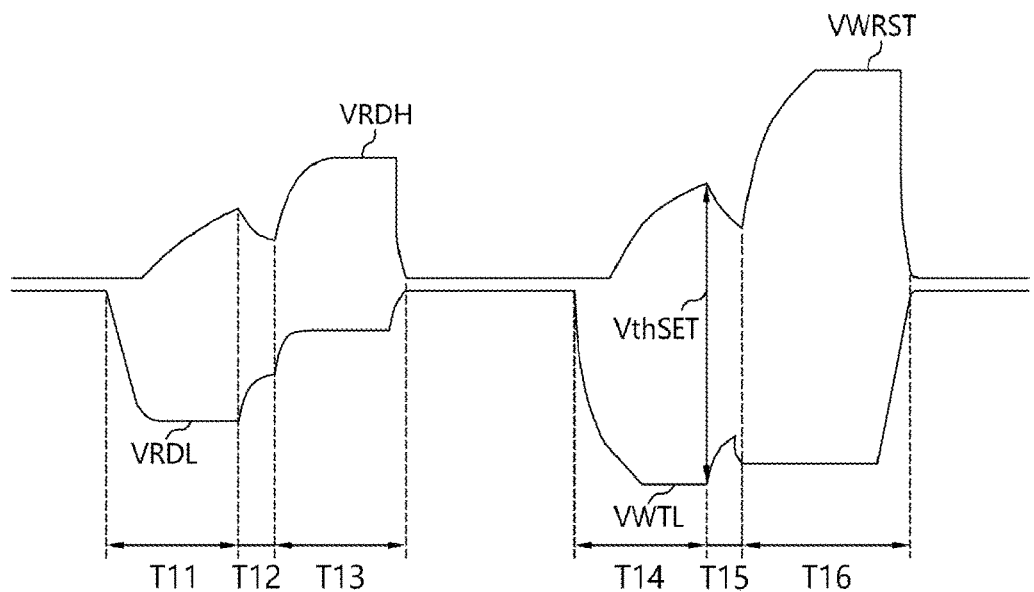
FIGS. 5A and 5B are representations of examples of waveform diagrams to assist in the explanation of operations of the semiconductor memory apparatus in accordance with an embodiment.
Figure 5B:
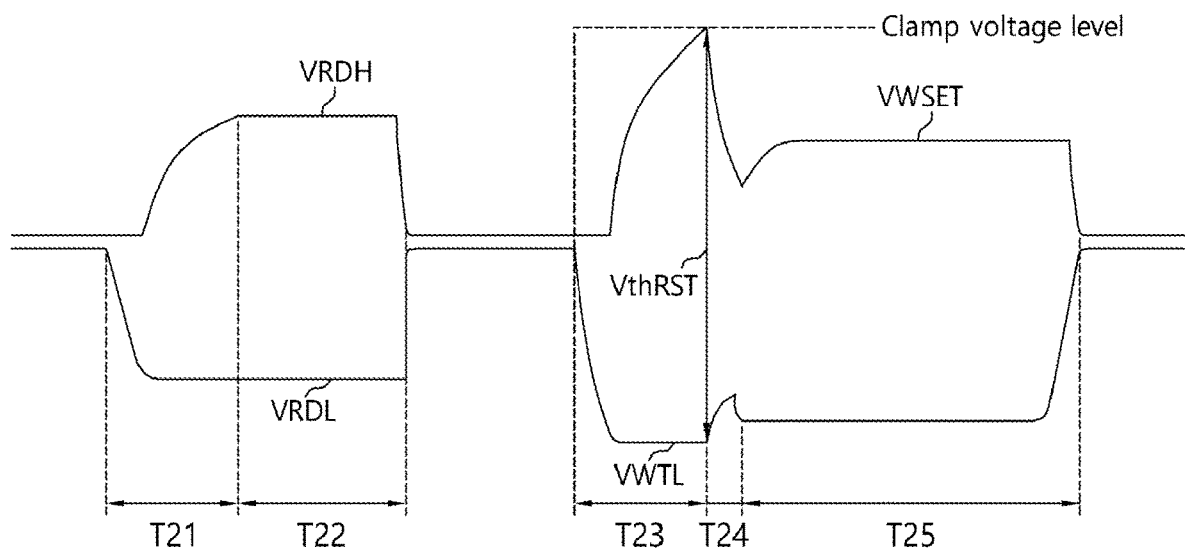

FIG. 5A is a representation of an example of a waveform diagram to assist in the explanation of an operation in which a reset program is performed when the resistance state of the memory cell 110 is the set state, and FIG. 5B is a representation of an example of a waveform diagram to assist in the explanation of an operation in which a set program is performed when the resistance state of the memory cell 110 is the reset state. The operations of the semiconductor memory apparatus 1 in accordance with an embodiment will be described below with reference to FIGS. 1 to 5B. First, in FIG. 5A, if the set write operation is performed, the current supply circuit 120 and the sense amplifier 180 may perform the pre-read operation. In a first time period T11, by the current supply circuit 120, the voltage level of the global word line GWL and the word line WL coupled with the memory cell 110 may be dropped to the level of a read low voltage VRDL, and the voltage level of the global bit line GBL and the bit line BL coupled with the memory cell 110 may gradually rise. When the resistance state of the memory cell 110 is the set state, the memory cell 110 may be turned on in a second time period T12, and a snapback may occur. If the snapback occurs, since an amount of current flowing through the memory cell 110 increases, the voltage level of the bit line BL may slightly fall, and the voltage level of the word line WL may rise. In a third time period T13, the voltage level of the bit line BL may rise to a voltage level corresponding to a read high voltage VRDH, and the voltage level of the word line WL may gradually rise. For example, the voltage level difference between the read high voltage VRDH and the read low voltage VRDL may correspond to the voltage level of the read reference voltage VREAD. After the third time period T13, the resistance state of the memory cell 110 may be determined to be the set state, and the pre-read operation may be ended.

Since the resistance state of the memory cell 110 is the set state, the reset write operation may be performed to change the resistance state of the memory cell 110. In a fourth time period T14, the voltage level of the word line WL may be lowered to a write low voltage VWTL by the second limit circuit 122, and the voltage level of the bit line BL may be raised by the first limit circuit 121. For example, the level of the write low voltage VWTL may be lower than the level of the read low voltage VRDL. At this time, the current supply circuit 120 might not clamp the voltage level across the memory cell 110 to provide a current sufficient to change the memory cell 110 to the reset state. The first limit circuit 121 might not clamp the voltage level of the global bit line GBL. In a fifth time period T15, if the voltage across the memory cell 110, that is, the voltage difference of the bit line BL and the word line WL, becomes equal to or higher than the set threshold voltage VthSET, the memory cell 110 may be turned on, and a snapback may occur. Therefore, the voltage level of the bit line BL may slightly fall, and the voltage level of the word line WL may slightly rise. In a sixth time period T16, the current supply circuit 120 may provide a reset pulse, and the first limit circuit 121 may keep the voltage level of the bit line BL to the level of a reset write high voltage VWRST and the second limit circuit 122 may keep the voltage level of the word line WL to the level of the write low voltage VWTL, thereby keeping the voltage level difference of the bit line BL and the word line WL to the second amplitude of the reset pulse. That is to say, the voltage level across the memory cell 110 may be kept to the second amplitude of the reset pulse. The reset pulse may be applied for the second pulse width, and the reset write operation may be ended after a time corresponding to the second pulse width. When the reset write operation for the memory cell 110 of the set state is performed, because the global bit line GBL is not clamped but the amount of current flowing through the memory cell 110 is large as the memory cell 110 is turned on, the voltage level of the global bit line GBL might not rise to the predetermined level. Thus, the current supply circuit 120 might not perform the clamping operation and apply a sufficient amount of current to the memory cell 110, and the voltage level across the memory cell 110 is kept to be lower than the level of the clamping voltage not to cause a disturbance to another memory cell.

Next, in FIG. 5B, if the reset write operation is performed, the current supply circuit 120 and the sense amplifier 180 may perform the pre-read operation. In a first time period T21, the voltage level of the global word line GWL and the word line WL coupled with the memory cell 110 may be dropped to the level of the read low voltage VRDL, and the voltage level of the global bit line GBL and the bit line BL coupled with the memory cell 110 may rise. When the resistance state of the memory cell 110 is the reset state, the memory cell 110 is not turned on, and a snapback might not occur. In a second time period T22, the voltage level of the bit line BL may be kept to a voltage level corresponding to the read high voltage VRDH, and the voltage level of the word line WL may be kept to a level corresponding to the read low voltage VRDL. After the second time period T22, the resistance state of the memory cell 110 may be determined to be the reset state, and the pre-read operation may be ended.

Since the resistance state of the memory cell 110 is the reset state, the set write operation may be performed to change the resistance state of the memory cell 110. In a third time period T23, the voltage level of the word line WL may be lowered to the write low voltage VWTL by the second limit circuit 122, and the voltage level of the bit line BL may be raised by the first limit circuit 121. The first limit circuit 121 may raise the voltage level of the bit line BL until the voltage across the memory cell 110, that is, the voltage difference between the bit line BL and the word line WL, becomes equal to or higher than the reset threshold voltage VthRST. At this time, the current supply circuit 120 may limit the voltage level across the memory cell 110 to the level of the clamping voltage. Accordingly, the voltage level of the bit line BL might not rise to become equal to or higher than the predetermined level. In a fourth time period T24, if the voltage across the memory cell 110 corresponds to the reset threshold voltage VthRST, the memory cell 110 may be turned on, and a snapback may occur. Therefore, the voltage level of the bit line BL may fall, and the voltage level of the word line WL may rise. In a fifth time period T25, the current supply circuit 120 may provide a set pulse, and the first limit circuit 121 may keep the bit line BL to a set write high voltage VWSET and the second limit circuit 122 may keep the word line WL to the write low voltage VWTL, thereby keeping the voltage level difference of the bit line BL and the word line WL to the first amplitude of the set pulse. That is to say, the voltage level across the memory cell 110 may be kept to the first amplitude of the set pulse. The set pulse may be applied for the first pulse width, and the set write operation may be ended after a time corresponding to the first pulse width. Since the voltage level across the memory cell 110 is clamped, the voltage level of the bit line BL may be limited to be lower than the predetermined voltage level. Thus, the voltage level between both ends of the memory cell 110 may be kept to be lower than the level of the clamping voltage, thereby not causing a disturbance to another memory cell.

Figure 6:
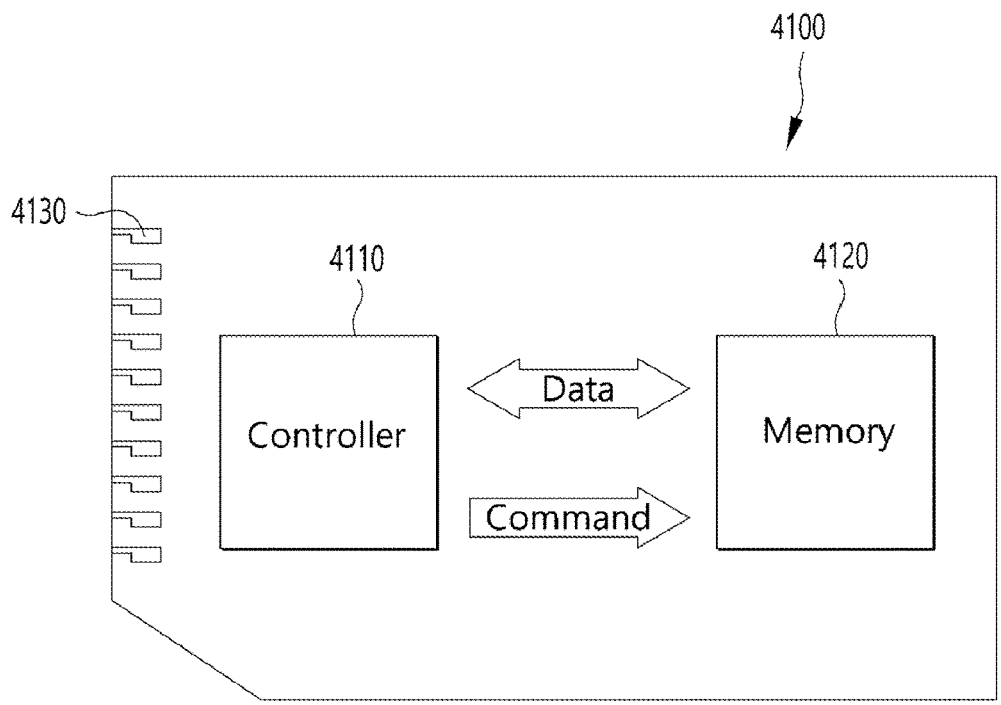
FIG. 6 is a schematic diagram illustrating a representation of an example of a memory card including the semiconductor memory apparatus in accordance with an embodiment.

FIG. 6 is a schematic diagram illustrating a representation of an example of a memory card including the semiconductor memory apparatus in accordance with the embodiments. Referring to FIG. 6, the memory card system 4100 may include a controller 4110, a memory 4120, and interface members 4130. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to an exterior. The memory 4120 may include the nonvolatile memory apparatus 1 according to the above-described embodiments.

The interface members 4130 may control the input/output of data from/to the exterior. The memory card system 4100 may be a multimedia card (MMC), a secure digital card (SD) or a portable data storage device.

Figure 7:
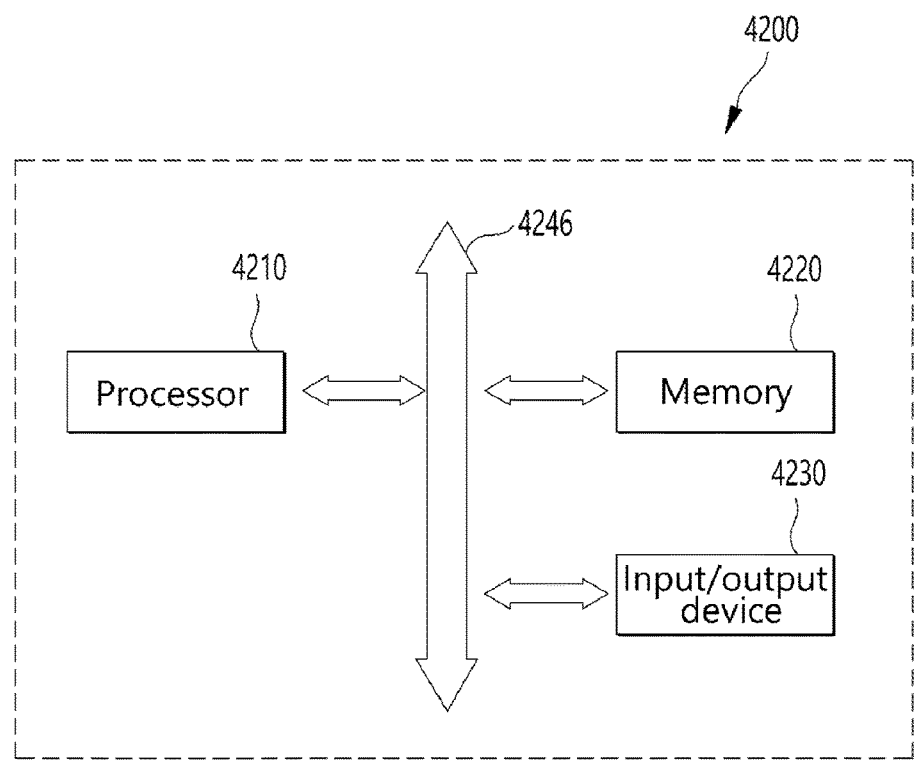
FIG. 7 is a representation of an example of a block diagram to assist in the explanation of an electronic apparatus including the semiconductor memory apparatus in accordance with an embodiment.

FIG. 7 is a representation of an example of a block diagram to assist in the explanation of an electronic apparatus including the semiconductor memory apparatus in accordance with the embodiments. Referring to FIG. 7, the electronic apparatus 4200 may include a processor 4210, a memory 4220, and an input/output device 4230. The processor 4210, the memory 4220 and the input/output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include the nonvolatile memory apparatus 1 according to the above-described embodiments. In order for detailed realization and modification, additional circuits and control signals may be provided.

The electronic apparatus 4200 may configure various electronic control apparatuses which need the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or all devices capable of transmitting and receiving information under wireless circumstances.

Descriptions will be made below for the detailed realization and modified examples of the electronic apparatus 4200, with reference to FIGS. 7 and 8.

Figure 8:
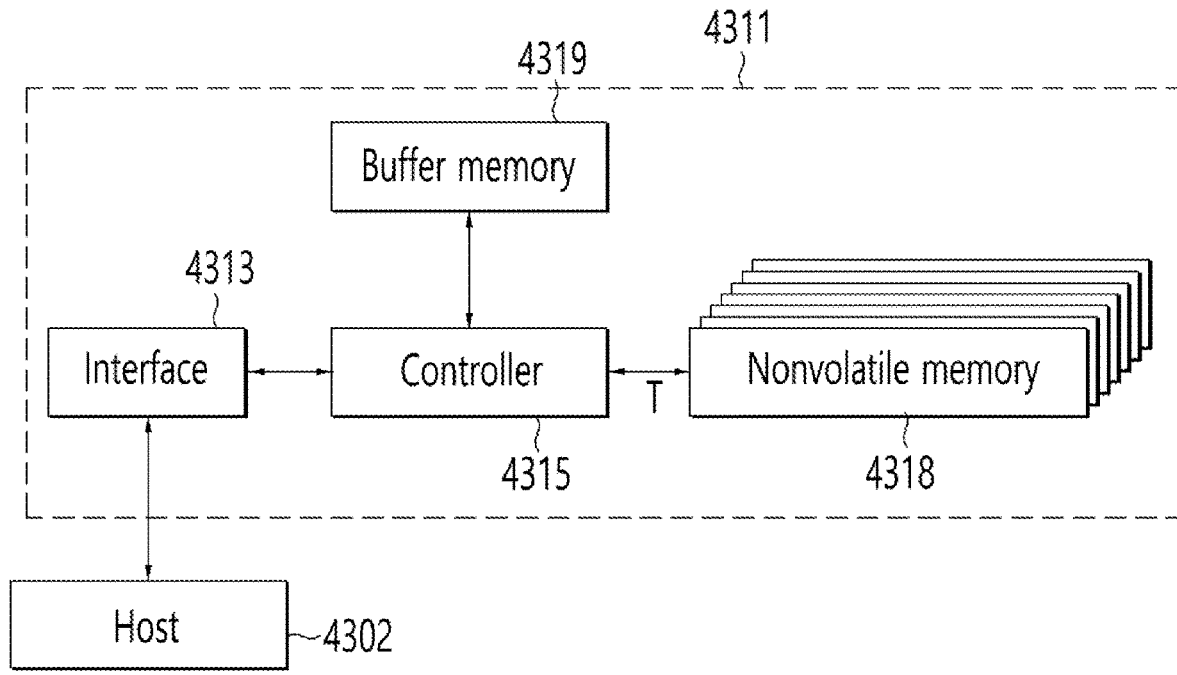
FIG. 8 is a block diagram illustrating a representation of an example of a data storage device including the semiconductor memory apparatus in accordance with an embodiment.
Figure 9:
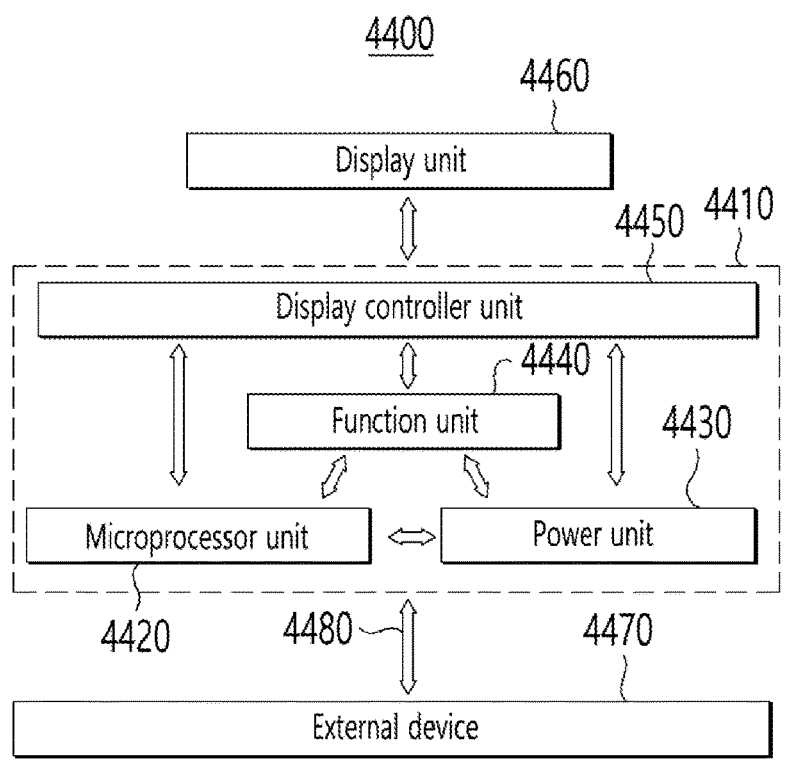
FIG. 9 is a block diagram illustrating a representation of an example of an electronic system including the semiconductor memory apparatus in accordance with an embodiment.

FIG. 8 is a block diagram illustrating a representation of an example of a data storage device including the semiconductor memory apparatus in accordance with the embodiments. Referring to FIG. 9, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that a speed is high, a mechanical delay, a failure rate, heat generation and noise generation decrease, and miniaturization and light weight may be accomplished, when compared to a hard disk drive (HDD). The solid state disk 4311 may be widely used in a notebook PC, a net book, a desktop PC, an MP3 player, or a portable storage device.

The controller 4315 may be formed adjacent to the interface 4313, and be electrically coupled to the interface 4313. The controller 4315 may be a microprocessor including a memory controller and a buffer controller. The nonvolatile memories 4318 may be formed adjacent to the controller 4315, and be electrically coupled to the controller 4315 via connection terminals T. The data storage capacity of the solid state disk 4311 may correspond to the nonvolatile memories 4318. The buffer memory 4319 may be formed adjacent to the controller 4315, and be electrically coupled to the controller 4315.

The interface 4313 may be coupled to a host 4302, and play the role of transmitting and receiving electrical signals such as data. For example, the interface 4313 may be a device which uses the same protocol as SATA, IDE, SCSI, and/or combination thereof. The nonvolatile memories 4318 may be coupled to the interface 4313 via the controller 4315.

The nonvolatile memories 4318 may play the role of storing the data received through the interface 4313. Each of the nonvolatile memories 4318 may include the nonvolatile memory apparatus 1 according to the above-described embodiments. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include the semiconductor memory apparatus 1 according to the above-described embodiments.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

FIG. 9 is a block diagram illustrating a representation of an example of an electronic system including the semiconductor memory apparatus in accordance with the embodiments. Referring to FIG. 9, the electronic system 4400 may include a body 4410, a microprocessor unit 4420, a power unit 4430, a function unit 4440, and a display controller unit 4450.

The body 4410 may be a motherboard which is formed by a printed circuit board (PCB). The microprocessor unit 4420, the power unit 4430, the function unit 4440 and the display controller unit 4450 may be mounted to the body 4410. A display unit 4460 may be disposed inside the body 4410 or outside the body 4410. For example, the display unit 4460 may be disposed on the surface of the body 4410, and display the image processed by the display controller unit 4450.

The power unit 4430 may play the role of receiving a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430, and control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone such as dialing, image outputting to the display unit 4460 through communication with an external device 4470, voice outputting to a speaker, and so forth. In the case where a camera is mounted together, the function unit 4440 may also play the role of a camera image processor.

In the case where the electronic system 4400 is coupled with a memory card or the like to extend capacity, the function unit 4440 may be a memory card controller. The function unit 4440 may exchange signals with the external device 4470 through a wired or to wireless communication unit 4480. In the case where the electronic system 4400 needs a USB or the like to expand functionality, the function unit 4440 may play the role of an interface controller. The semiconductor memory apparatus 1 in accordance with the above-described embodiments may be applied as at least any one of the microprocessor unit 4420 and the function unit 4440.

While various embodiments have been described above, it will be understood to those skilled in the art that the embodiments described are examples only. Accordingly, the semiconductor memory apparatus and the operating method thereof described herein should not be limited based on the described embodiments.

What is claimed is:

1. A semiconductor memory apparatus comprising:
    a memory cell; and
    a current supply circuit configured to perform a write operation by changing an amount of current flowing through the memory cell, perform a reset write operation without limiting a voltage level across the memory cell, and limit the voltage level across the memory cell to a level of a clamping voltage in a set write operation.

2. The semiconductor memory apparatus according to claim 1,
    wherein the memory cell is coupled between a global bit line and a global word line, and
    wherein the current supply circuit comprises:
    a first limit circuit coupled with the global bit line, and configured to change a current applied to the memory cell; and
    a second limit circuit coupled with the global word line, and configured to change a current flowing through the memory cell.

3. The semiconductor memory apparatus according to claim 2, wherein the first limit circuit changes a voltage level of the global bit line, and the second limit circuit changes a voltage level of the global word line.

4. The semiconductor memory apparatus according to claim 2, further comprising:
    a write controller configured to control the first and second limit circuits based on a reset write signal and a set write signal.

5. The semiconductor memory apparatus according to claim 2, further comprising:
    a bit line supply configured to provide a high voltage to the first limit circuit; and
    a word line supply configured to provide a low voltage having a level lower than the high voltage, to the second limit circuit.

6. The semiconductor memory apparatus according to claim 2, further comprising:
    a column switch configured to couple one end of the memory cell and the global bit line based on a bit line select signal; and
    a row switch configured to couple the other end of the memory cell and the global word line based on a word line select signal.

7. A semiconductor memory apparatus comprising:
    a memory cell; and
    a current supply circuit configured to perform a write operation by changing an amount of current flowing through the memory cell, and selectively limit a voltage level across the memory cell to a level of a clamping voltage based on whether the write operation is a set write operation or a reset write operation.

8. The semiconductor memory apparatus according to claim 7, wherein the current supply circuit limits the voltage level across the memory cell to the level of the clamping voltage during the set write operation, and performs the reset write operation without limiting the voltage level across the memory cell to the level of the clamping voltage.

9. The semiconductor memory apparatus according to claim 8,
    wherein the memory cell is coupled between a global bit line and a global word line, and
    wherein the current supply circuit comprises:

a first limit circuit coupled with the global bit line, and configured to change a current applied to the memory cell; and a second limit circuit coupled with the global word line, and configured to change a current flowing through the memory cell.

10. The semiconductor memory apparatus according to claim 9, wherein the first limit circuit changes a voltage level of the global bit line, and the second limit circuit changes a voltage level of the global word line.

11. The semiconductor memory apparatus according to claim 9, further comprising:
    a write controller configured to control the first and second limit circuits based on a reset write signal and a set write signal.

12. The semiconductor memory apparatus according to claim 9, further comprising:
    a bit line supply configured to provide a high voltage to the first limit circuit; and
    a word line supply configured to provide a low voltage having a level lower than the high voltage, to the second limit circuit.

13. The semiconductor memory apparatus according to claim 9, further comprising:
    a column switch configured to couple one end of the memory cell and the global bit line based on a bit line select signal; and
    a row switch configured to couple the other end of the memory cell and the global word line based on a word line select signal.

14. A method for operating a semiconductor memory apparatus, comprising:
    determining a resistance state of a memory cell by performing a pre-read operation when a set write operation or a reset write operation is started; and
    selectively limiting a voltage across a memory cell to a level of a clamping voltage based on whether it is a set write operation or a reset write operation.

15. The method according to claim 14, wherein a write operation is ended when the resistance state of the memory cell determined through the determining during the set write operation is a set state.

16. The method according to claim 14, wherein a write operation is ended when the resistance state of the memory cell determined through the determining during the reset write operation is a reset state.

17. The method according to claim 14, wherein the selectively limiting limits a level of the voltage across the memory cell to the level of the clamping voltage and provides a set pulse to the memory cell, during the set write operation.

18. The method according to claim 14, wherein the selectively limiting does not limit a level of the voltage across the memory cell to the level of the clamping voltage and provides a reset pulse to the memory cell, during the reset write operation.

19. A semiconductor memory apparatus comprising:
    a memory cell; and
    a current supply circuit configured to change a resistance state of the memory cell, by changing an amount of current flowing through the memory cell, with or without limiting a voltage level across the memory cell to a level of a clamping voltage based on a state of the memory cell prior to changing the resistance state of the memory cell.

20. The semiconductor memory apparatus according to claim 19, wherein the current supply circuit changes the resistance state of the memory cell without limiting the voltage level across the memory cell if the state of the memory cell is a set state prior to changing the resistance state of the memory cell.

21. The semiconductor memory apparatus according to claim 20, wherein the current supply circuit changes the resistance state of the memory cell without limiting the voltage level across the memory cell in a reset write operation.

22. The semiconductor memory apparatus according to claim 19, wherein the current supply circuit limits the voltage level across the memory cell to the level of the clamping voltage if the state of the memory cell is a reset state prior to changing the resistance state of the memory cell.

23. The semiconductor memory apparatus according to claim 22, wherein the current supply circuit limits the voltage level across the memory cell to the level of the clamping voltage in a set write operation.

24. The semiconductor memory apparatus according to claim 19, wherein the amount of the current flowing through the memory cell is changed during a write operation.

25. The semiconductor memory apparatus according to claim 19, wherein the state of the memory cell, prior to changing the resistance state of the memory cell, is determined during a pre-read operation.

26. The semiconductor memory apparatus according to claim 19,
    wherein the memory cell is coupled to a global bit line, and
    wherein the current supply circuit includes a first limit circuit coupled with the global bit line, and configured to change a current applied to the memory cell by clamping the global bit line to limit the voltage level across the memory cell.

27. The method according to claim 14, wherein the selectively limiting a voltage across the memory cell to the level of the clamping voltage is further based on the determined resistance state of the memory cell.

* * * * *